(12) United States Patent
Takagi et al.

(10) Patent No.: US 8,773,016 B2
(45) Date of Patent: *Jul. 8, 2014

(54) DISPLAY APPARATUS INCLUDING LIGHT EMITTING ELEMENTS AND A LIGHT SHIELDING PORTION DISPOSED ON THE LIGHT EMITTING ELEMENTS AND AN ELECTRONIC DEVICE INCLUDING SAME

(75) Inventors: Akitsuna Takagi, Aichi (JP); Jiro Yamada, Kanagawa (JP); Toshihiro Fukuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 96 days.

This patent is subject to a terminal disclaimer.

(21) Appl. No.: 13/487,949

(22) Filed: Jun. 4, 2012

(65) Prior Publication Data
US 2012/0243221 A1 Sep. 27, 2012

Related U.S. Application Data

(63) Continuation of application No. 12/039,473, filed on Feb. 28, 2008, now Pat. No. 8,198,805.

(30) Foreign Application Priority Data

Mar. 15, 2007 (JP) ................ 2007-066108

(51) Int. Cl.
*H05B 33/00* (2006.01)
*H01J 5/16* (2006.01)

(52) U.S. Cl.
USPC ........... 313/506; 313/504; 313/512; 313/110; 428/690

(58) Field of Classification Search
USPC .................................. 313/504–506
See application file for complete search history.

(56) References Cited

U.S. PATENT DOCUMENTS

2007/0164662 A1 7/2007 Eida et al.

FOREIGN PATENT DOCUMENTS

| JP | 2004-326130 | 11/2004 |
|----|-------------|---------|
| JP | 2005-235566 | 9/2005 |
| JP | 2005-293946 | 10/2005 |
| JP | 2007-188653 | 7/2007 |
| WO | 2005/098802 | 10/2005 |

OTHER PUBLICATIONS

JP Office Action for corresponding Japanese Patent Application 2007-066108 dated Jul. 27, 2011.

*Primary Examiner* — Sikha Roy
(74) *Attorney, Agent, or Firm* — K&L Gates LLP

(57) ABSTRACT

A display apparatus, includes: a substrate; a plural light emitting elements provided on the substrate and each formed from a lower electrode, a light emitting function layer and an upper layer stacked in this order; a partition for element isolation provided on the substrate and having a plural apertures individually corresponding to the light emitting elements; and a black matrix disposed on the light extraction side of the light emitting elements and having a shape with which the black matrix covers over portions. Each of the apertures of the partition having a side wall is formed in such a tapering shape that the aperture width increases toward the light extraction side of the light emitting elements. The black matrix is provided in such a manner as to cover over an upper edge portion of the tapering shape on at least one side which defines each aperture of the partition.

13 Claims, 11 Drawing Sheets

F I G. 4
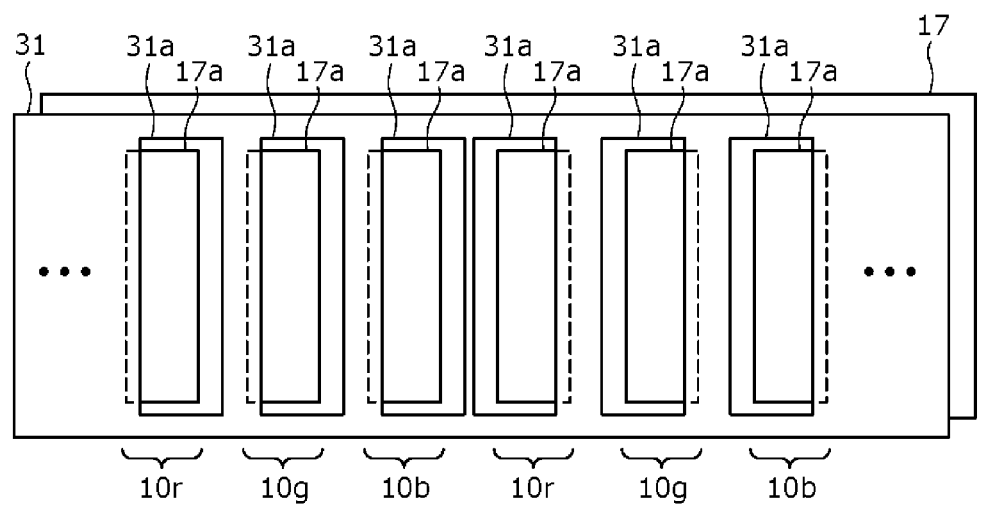
F I G. 5
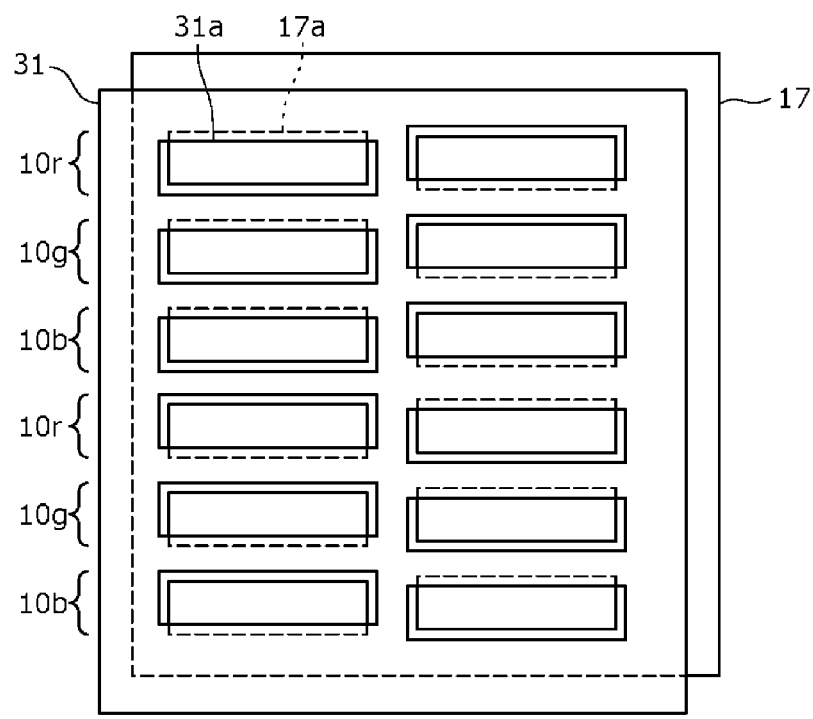

DISPLAY APPARATUS INCLUDING LIGHT EMITTING ELEMENTS AND A LIGHT SHIELDING PORTION DISPOSED ON THE LIGHT EMITTING ELEMENTS AND AN ELECTRONIC DEVICE INCLUDING SAME

CROSS REFERENCES TO RELATED APPLICATIONS

The present application is a continuation of U.S. application Ser. No. 12/039,473, filed on Feb. 28, 2008, which claims priority to Japanese Patent Application JP2007-066108 filed with the Japan Patent Office on Mar. 15, 2007, the entire contents of which are incorporated herein by reference.

BACKGROUND

The present application relates to a display apparatus and an electronic device, and more particularly to a display apparatus wherein a plurality of light emitting elements such as organic electroluminescence elements are arrayed on a substrate and an electronic device which incorporates the display apparatus.

An organic electroluminescence light emitting element (organic EL element) which makes use of electroluminescence (EL) of an organic material attracts attention as a light emitting element which is superior in high speed responsibility and can emit light of high luminance by low voltage dc driving. The organic EL element includes an organic layer including a light emitting layer sandwiched between two electrodes such that emitted light is extracted through one of the electrodes. A display apparatus called organic EL display apparatus in which such an organic EL element as just described is used includes a plurality of organic EL elements arrayed on a substrate.

Meanwhile, in an organic EL display apparatus of the active matrix driving type, a pixel circuit is provided corresponding to each pixel on a substrate, and organic EL elements are formed and arrayed on a flattening insulating film which covers such pixel circuits. Such organic EL elements are isolated from each other in the following manner by a partition. In particular, lower electrodes are provided in rows and columns and individually formed in a pattern in pixels such that they are individually connected to pixel circuits, and a partition is provided in a state wherein it covers peripheral edges of the lower electrodes. An organic layer including a light emitting element is formed and stacked on the lower electrodes which are exposed through apertures of the partition, and an upper electrode is formed and stacked on the organic layer. It is significant that, in the state described above, the lower electrodes and the upper electrode are isolated from each other by the partition and the organic layers.

Also a display apparatus of the type described is known which is configured such that an embedding substrate is provided on a side opposing to organic EL elements and a black matrix and color filters are provided on the embedding substrate. The black matrix in this instance is provided in a width with which it covers wiring lines for pixel circuits provided between pixels and prevents reflection of external light by the wiring lines.

For such a black matrix as just described, a configuration has been proposed wherein the film thickness of the black matrix is adjusted with respect to the film thickness of the color filters to prevent color mixture of display colors. The black matrix of the type just described is disclosed, for example, in Japanese Patent Laid-Open No. 2004-326130. Further, for a configuration wherein auxiliary wiring lines are provided between pixel apertures, a configuration which includes a black matrix provided on the auxiliary wiring lines to prevent reflection of external light by the auxiliary wiring lines has been proposed. The configuration just described is disclosed, for example, in Japanese Patent Laid-Open No. 2005-293946.

SUMMARY

It is examined to apply such an organic EL display apparatus as described above not only to a large-sized display apparatus such as a monitor but also to such a small-sized display apparatus as represented by a viewer. In this instance, in order to differentiate the organic EL display apparatus from existing liquid crystal display apparatus from a point of view of the display performance, it is necessary to raise the performance of the organic EL display apparatus as high as possible. Since it is considered that an organic EL display apparatus in the past does not achieve sufficient visual observability at a light place or sufficient color impurity as yet, there is a sufficient room for improvement. One of points for improvement is a problem of reflection of light by side walls of a partition. In particular, it is confirmed that, where the display apparatus is observed from the front, external light incoming at any angle other than the angle from the front with respect to the substrate is reflected by the side walls of the partition and emitted to the front of the substrate thereby to deteriorate the visual observability. Also it is confirmed that, where the display apparatus is observed from any other direction than a direction from the front thereof, external light incoming at any other angle than an angle at which it is reflected regularly with respect to the substrate is reflected by the side walls of the partition and emitted toward the observer thereby to deteriorate the visual observability.

Therefore, it is desirable to provide a display apparatus wherein deterioration of the visual observability by reflection of light by side walls of a partition which covers peripheral edges of lower electrodes formed in a pattern for individual pixels can be prevented thereby to achieve a good display characteristic and an electronic device which includes such a display apparatus as just described.

According to an embodiment, there is provided a display apparatus including a substrate, a plurality of light emitting elements, a partition, and a black matrix. The plurality of light emitting elements is provided on the substrate and each is formed from a lower electrode, a light emitting function layer and an upper layer are stacked in this order. The partition for element isolation is provided on the substrate and has a plurality of apertures individually corresponding to the light emitting elements. The black matrix is disposed on the light extraction side of the light emitting elements and has a shape with which the black matrix covers over portions between the light emitting elements. Each of the apertures of the partition having a side wall is formed in such a tapering shape that the aperture width increases toward the light extraction side of the light emitting elements. The black matrix is provided in such a manner as to cover over an upper edge portion of the tapering shape on at least one side which defines each aperture of the partition.

According to another embodiment, there is provided an electronic device including a display panel. The display panel includes a substrate, a plurality of light emitting elements, a partition, and a black matrix. The plurality of light emitting elements is provided on the substrate and each formed from a lower electrode, a light emitting function layer and an upper layer are stacked in this order. The partition for element isolation is provided on the substrate and has a plurality of apertures individually corresponding to the light emitting elements. The black matrix is disposed on the light extraction side of the light emitting elements and has a shape with which the black matrix covers over portions between the light emitting elements. Each of the apertures of the partition having a side wall is formed in such a tapering shape that the aperture width increases toward the light extraction side of the light emitting elements. The black matrix is provided in such a manner as to cover over an upper edge portion of the tapering shape on at least one side which defines each aperture of the partition.

In the display apparatus and the electronic device, external light incoming to the substrate from the light extraction direction is prevented from being reflected by the side wall of the tapering shape of each aperture of the partition toward the front direction. Particularly, the upper edge portion of the tapering shape of each of the apertures of the partition is a portion at which the inclination angle gradually increases from a direction toward the front of the substrate. Therefore, while the external light passing through the apertures of the black matrix and incoming at a shallow angle with respect to a normal to the substrate is likely to be reflected toward the front direction of the substrate by the upper edge portions, since the upper edge portion is covered with the black matrix, the reflected external light is prevented from being emitted toward the front direction. On the other hand, where external light to the substrate side from the light extraction direction enters at an angle proximate a parallel direction with respect to a normal to the substrate, although the external light is likely to be reflected toward directions other than the front direction of the substrate by the upper edge portions of the tapering shape of the apertures of the partition, this reflection can be prevented by covering the upper edge portions with the black matrix.

With the display apparatus and the electronic device, since external light incoming to side walls of a plurality of apertures provided in the partition can be prevented from being reflected toward the front face direction of the substrate or toward directions other than the front face direction, deterioration of the visual observability of display light caused by reflection of external light can be prevented. Consequently, enhancement of the display characteristic of the display apparatus can be anticipated.

Additional features and advantages are described herein, and will be apparent from the following Detailed Description and the figures.

BRIEF DESCRIPTION OF THE FIGURES

FIGS. 4 and 5 are plan views illustrating different arrangement states of the black matrix in the display apparatus;

DETAILED DESCRIPTION

An embodiment of the present application will be described in detail with reference to on the drawings.

Figure 1:
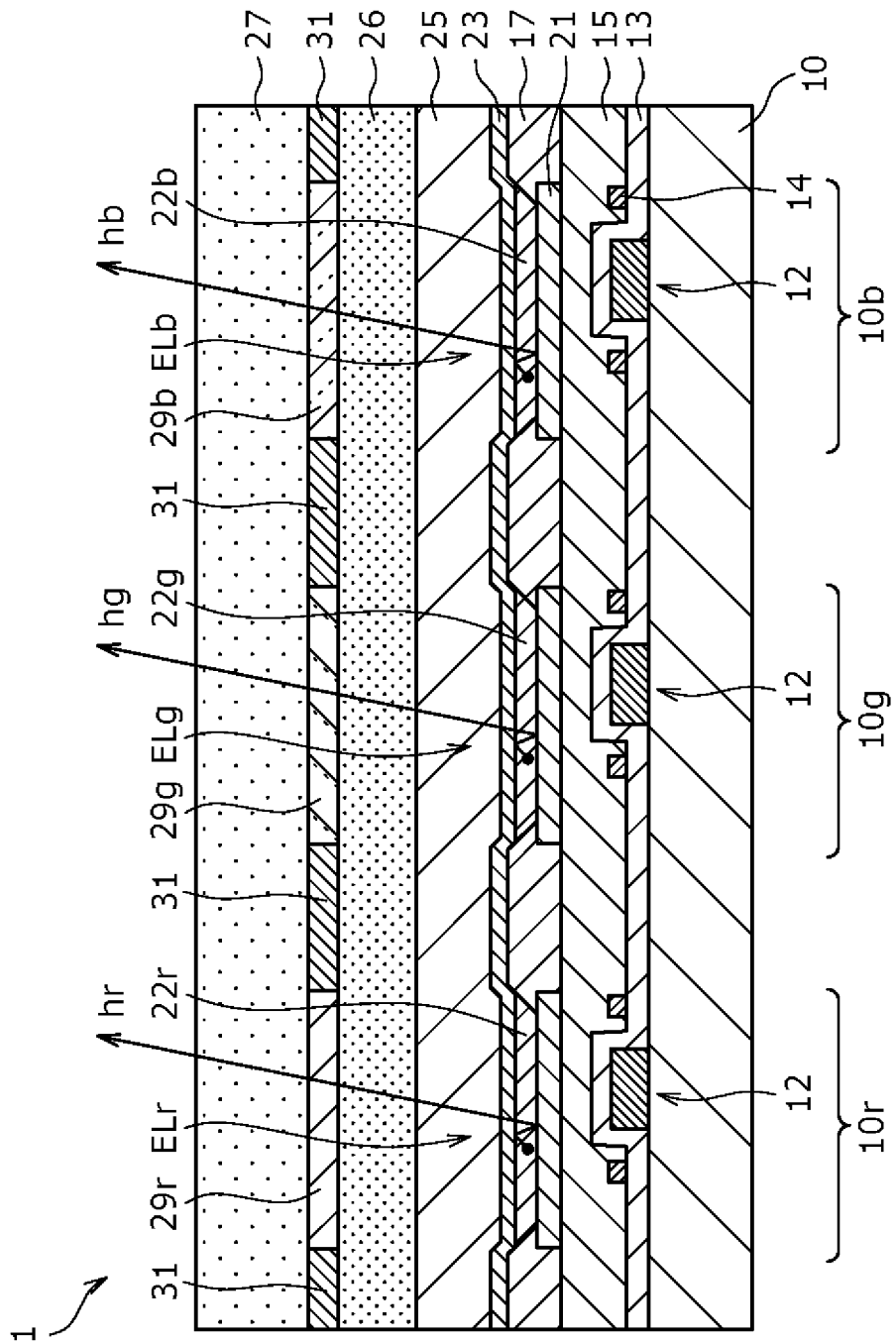
FIG. 1 is a partial schematic sectional view showing a configuration of a display apparatus to which the present embodiment is applied.

FIG. 1 shows a configuration of a display apparatus to which the present embodiment is applied. Referring to FIG. 1, the display apparatus 1 shown is formed as an organic EL display apparatus wherein organic electroluminescence light emitting elements ELr, ELg and ELb are disposed on pixels 10r, 10g and 10b on a substrate 10, respectively. A red light emitting element ELr which emits red light hr is disposed in each of the red pixels 10r; a green light emitting element ELg which emits green light hg is disposed in each of the green pixels 10g; and a blue light emitting element ELb which emits blue light hb is disposed in each of the blue pixels 10b. The color light beams hr, hg and hb radiated from the organic electroluminescence light emitting elements ELr, ELg and ELb, respectively, are taken out from the opposite side to the substrate 10. Thus, the display apparatus 1 is configured so as to have a top emission type structure. First, a general configuration of the display apparatus 1 is described in order from the lower layer side.

Thin film transistors (TFTs) 12, an insulating layer 13, driving wiring lines 14 and a flattening insulating layer 15 are provided on the substrate 10. The organic electroluminescence elements ELr, ELg and ELb which emit light beams of the individual colors are provided on the flattening insulating layer 15.

Each of the organic electroluminescence light emitting elements ELr, ELg and ELb is formed from a lower electrode 21 formed, for example, from a reflecting electrode, a light emitting function layer 22r, 22g or 22b formed by principally stacking an organic material and a common upper electrode 23 made of a translucent material. The organic electroluminescence light emitting elements ELr, ELg and ELb are isolated from each other by a partition 17 called window insulating film which covers peripheral edges of the lower electrodes 21. In the present embodiment, the display apparatus 1 is characterized in the shape of the partition 17 which isolates the organic electroluminescence light emitting elements ELr, ELg and ELb from one another.

An enclosure substrate 27 is adhered to the organic electroluminescence light emitting elements ELr, ELg and ELb with a protective layer 25 and an adhesion layer 26 interposed therebetween. Color filters 29r, 29g and 29b are provided at positions opposing to the organic electroluminescence light emitting elements ELr, ELg and ELb on a face of the enclosure substrate 27 adjacent the organic electroluminescence light emitting elements ELr, ELg and ELb, respectively. A black matrix 31 is disposed between the color filters 29r, 29g and 29b. In the present embodiment, the display apparatus 1 is characterized in the arrangement state of the black matrix 31 with respect to the partition 17, and the characteristic feature is hereinafter described.

Now, a detailed configuration of the individual members described above is described.

The substrate 10 supports the other components of the display apparatus 1 such as the TFTs 12 and the organic electroluminescence light emitting elements ELr, ELg and ELb and is made of an insulating material such as, for example, a silicon (Si) material or a plastic material.

The TFTs 12 are provided to drive the organic electroluminescence light emitting elements ELr, ELg and ELb and are disposed, for example, in a matrix corresponding to the pixels 10r, 10g and 10b of the substrate 10. It is to be noted that the structure itself of the TFTs 12 is not limited particularly but may be a bottom gate type structure or a top gate type structure.

The insulating layer 13 electrically isolates the TFTs 12 from surroundings and is made of an insulating material such as, for example, silicon dioxide ($SiO_2$) or PSG (Phospho-Silicate Glass). The insulating layer 13 is disposed in such a manner as to cover, for example, the TFTs 12 and the substrate 10 around the TFTs 12.

The driving wiring lines 14 drive the organic electroluminescence elements EL (ELr, ELg and ELb) and are made of a conductive material such as, for example, aluminum (Al) or aluminum-copper alloy (AlCu). The driving wiring lines 14 are provided as signal lines, power supply lines or some other wiring lines for the TFTs 12 and are electrically connected to the TFTs 12 through contact holes (not shown) provided in the insulating layer 13.

The flattening insulating layer 15 electrically isolates the TFTs 12 and driving wiring lines 14 and the organic electroluminescence light emitting elements ELr, ELg and ELb from each other and flattens the foundation on which the organic electroluminescence light emitting elements ELr, ELg and ELb are disposed. The flattening insulating layer 15 is made of an insulating material such as, for example, silicon dioxide ($SiO_2$). It is to be noted that, though not shown in FIG. 1, for example, capacitors for driving the TFTs 12, multilayer wiring lines for electrically connecting the driving wiring lines 14 and the organic electroluminescence elements EL and so forth are embedded in the flattening insulating layer 15.

Each of the organic electroluminescence light emitting elements ELr, ELg and ELb has the following configuration.

Each of the organic electroluminescence light emitting elements ELr, ELg and ELb is an element of the self luminous type which makes use of an organic EL phenomenon to emit light for image display. As described above, red light emitting elements ELr which emit red light hr having a wavelength typically of approximately 620 nm, green light emitting elements ELg which emit green light hg having a wavelength typically of 530 nm and blue light emitting elements ELb which emit blue light hb having a wavelength typically of 460 nm are disposed. A plurality of sets of such organic electroluminescence light emitting elements ELr, ELg and ELb each including one red light emitting element ELr, one green light emitting element ELg and one blue light emitting element ELb are disposed in a matrix corresponding to an array pattern of the TFTs 12.

Figure 2:
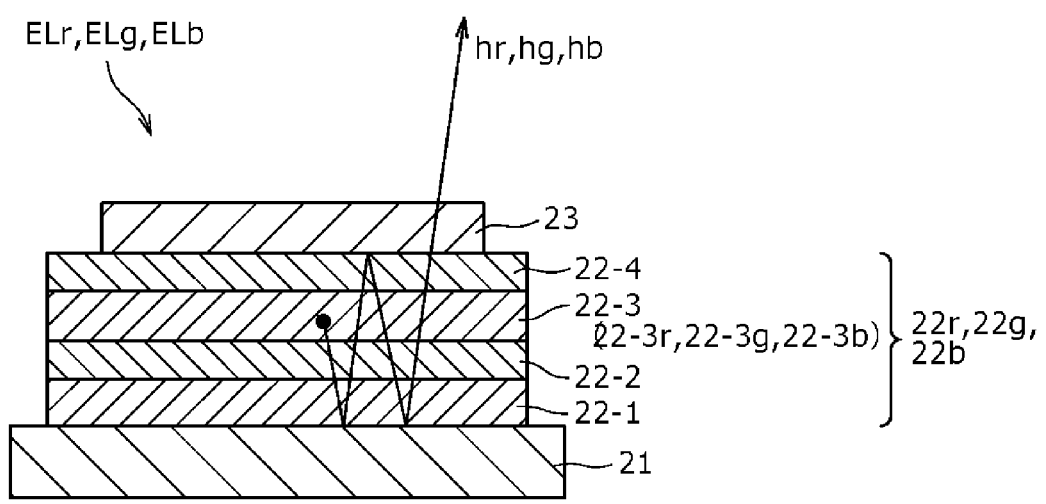
FIG. 2 is a schematic sectional view showing a configuration of an organic electroluminescence light emitting element provided in the display apparatus.

Referring also to FIG. 2, the layers which form the organic electroluminescence light emitting elements ELr, ELg and ELb have such a configuration as described below.

In particular, the lower electrodes 21 are formed in a pattern individually for the pixels 10r, 10g and 10b. Each of the lower electrodes 21 is electrically connected to a driving wiring line 14 through a contact hole not shown formed in the flattening insulating layer 15.

Each of the lower electrodes 21 is provided as an anode and made of an electrode material having a light reflecting property. As the electrode material, for example, aluminum, alloy containing aluminum (Al), silver (Ag) or alloy containing silver is used. The "alloy containing aluminum" is alloy which contains aluminum as a main component and may be, for example, aluminum-neodymium alloy (AlNd; for example, Al:Nd=90% by weight:10% by weight). Meanwhile, the "alloy containing silver" is alloy which contains silver as a main component and may be, for example, silver-palladium-copper alloy (AgPdCu; for example, Ag:Pd:Cu=99% by weight:0.75% by weight:0.25% by weight).

The light emitting function layers 22r, 22g and 22b include a light emitting layer which substantially utilizes an organic EL phenomenon to emit light of a particular color. Such light emitting function layers 22r, 22g and 22b have a stack structure wherein, for example, a hole injecting layer 22-1, a hole transport layer 22-2 and a light emitting layer 22-3 (22-3r, 22-3g or 22-3b) which emits light of a corresponding color and an electron transport layer 22-4 are stacked in order from the lower electrode 21 side serving as an anode. Here, the light emitting layers 22-3 are formed in a pattern for individual pixels while each of the other layers is continuously formed commonly to the pixels 10r, 10g and 10b with a uniform thickness.

The hole injecting layer 22-1 is provided to inject holes into the hole transport layer 22-2 and made of, for example, 4,4', 4"-tris(3-methyl-phenyl-phenylamino)triphenylamine (MT-DATA).

The hole transport layer 22-2 transports holes injected from the hole injecting layer 22-1 to the light emitting layer 22-3 and is made of, for example, bis[(N-naphtyl)-N-phenyl] benzidine (α-NPD).

Further, the red light emitting layer 22-3r from among the light emitting layers 22-3 makes use of an organic EL phenomenon to emit light of red and is made of, for example, 8-quinolinol-aluminum complex (Alq) in which 4-dicyanomethylene-6-(P-dimethylaminosytil)-2-methyl-4H-pyran (DCM) is mixed by approximately 2% by volume. The green light emitting layer 22-3g makes use of an organic EL phenomenon to generate green light and is made of, for example, 8-quinolinol-aluminum complex (Alq). The blue light emitting layer 22-3b makes use of an organic EL phenomenon to generate blue light and is made of, for example, bathocuproine (BCP).

The electron transport layer 22-4 transports electrons to the light emitting layer 22-3 and is made of, for example, 8-quinolinol-aluminum complex (Alq).

The upper electrode 23 on the light emitting function layers 22r, 22g and 22b is provided as a continuous layer common to all pixels 10r, 10g and 10b. The upper electrode 23 is provided as a cathode and functions as a half mirror which reflects light generated by the light emitting function layers 22 (22r, 22g and 22b) so as to resonate and then introduces the light to the outside. The upper electrode 23 is made of a conductive material having a light translucent property and has a single-layer structure made of, for example, silver (Ag) or alloy containing silver. The "alloy containing silver" is alloy which contains silver and may be, for example, silver magnesium alloy (AgMg; for example, Ag:Mg=10% by weight:90% by weight).

Particularly, the reflection factor of the upper electrode 23 serving as the extraction side of generated light is within a range, for example, from approximately 10% to 95%. It is to be noted that the upper electrode 23 need not have a single layer structure but may have a stack structure formed from different materials from each other. More particularly, the upper electrode 23 serving as a cathode may have a two-layer structure wherein a layer, that is, a lower layer, made of, for example, alloy containing magnesium (Mg) and silver (Ag) and another layer, that is, an upper layer, made of silver or alloy containing silver are stacked in this order. The "alloy containing magnesium and silver" is alloy which contains magnesium and silver and may be, for example, magnesium silver alloy (MgAg:Mg:Ag=for example, 5% by weight:1 to 20% by weight:1% by weight). Meanwhile, the "alloy containing silver" is alloy which contains silver and may be, for example, silver magnesium alloy (AgMg; for example, Ag:Mg=10% by weight:90% by weight).

Further, each of the organic electroluminescence light emitting elements ELr, ELg and ELb has a resonator structure which reflects light emitted from the light emitting layer 22-3 between a lower electrode 21 and the upper electrode 23 and functions as a kind of narrow-band filter. The optical distance L between the lower electrode 21 and the upper electrode 23 is a factor which corresponds to the resonance characteristic of the resonator structure described above and satisfies the relationship of the following expression (1):

$$(2L)/\lambda + \Phi/(2\pi) = m \quad (1)$$

where "λ" is a peak wavelength of a spectrum of each of the color light beams hr, hg and hb extracted from the pixels 10r, 10g and 10b, respectively, "Φ" is a phase shift which appears when light generated by each of the light emitting function layers 22r, 22g and 22b of the organic electroluminescence light emitting elements ELr, ELg and ELb is generated between and by the lower electrode 21 and the upper electrode 23, and "m" is zero or an integer.

In the display apparatus 1 having the configuration described above, the optical distance L of the organic electroluminescence light emitting elements ELr, ELg and ELb is adjusted with the film thickness of the light emitting function layers 22r, 22g and 22b between the lower electrode 21 which has the light reflecting property and the upper electrode 23 which functions as a half mirror. For example, where only the light emitting layer 22-3 from among the light emitting function layers 22 has a pattern formed thereon, the optical distance L is adjusted by the light emitting layers 22-3 (22-3r, 22-3g and 22-3b) individually for the color light beams hr, hg and hb to be taken out from the pixels.

In the display apparatus 1 having the configuration described above, the organic electroluminescence light emitting elements ELr, ELg and ELb of different colors formed by stacking the lower electrode 21, light emitting function layers 22r, 22g and 22b and upper electrode 23 are disposed on the pixels 10r, 10g and 10b, respectively.

Referring to FIG. 1, the partition 17 is provided to isolate the organic electroluminescence light emitting elements ELr, ELg and ELb from each other and is made of an organic insulating material such as, for example, polyimide or polybensoxazole or an inorganic insulating material such as, for example, silicon dioxide (SiO$_2$).

The partition 17 is provided on the flattening insulating layer 15 in such a manner as to cover end edges of the lower electrodes 21, and have apertures 17a (FIGS. 4 to 9) through which central portions of the lower electrodes 21 are exposed. The light emitting function layers 22 are provided in such a manner as to cover over the apertures 17a, and the organic electroluminescence light emitting elements ELr, ELg and ELb are provided in an isolated relationship from the lower electrodes 21 by the light emitting function layers 22 and the partition 17 while the upper electrode 23 is provided thereon.

Therefore, the apertures 17a of the partition 17 correspond as they are to the pixel apertures and serve as formation portions of the organic electroluminescence light emitting elements ELr, ELg and ELb of the stack structure described above. Each of the apertures 17a is configured such that side walls thereof are inclined in a tapering shape such that the aperture width increases in an upward direction, that is, toward the emitting side of generated light from the organic electroluminescence light emitting elements ELr, ELg and ELb in order to prevent disconnection of the upper electrode 23 stacked as an upper layer.

The protective layer 25 principally protects the organic electroluminescence light emitting elements ELr, ELg and ELb and is formed from a passivation film made of a light passing dielectric material such as, for example, silicon nitride (SiN).

The adhesion layer 26 is used to adhere the enclosure substrate 27 to the protective layer 25 and formed from an adhesive material such as, for example, a heat setting resin material.

The enclosure substrate 27 emits color light beams hr, hg and hb for image display emitted from the pixels 10r, 10g and 10b as display light to the outside of the display apparatus 1 and is made of a light transmitting insulating material such as, for example, glass.

The color filters 29r, 29g and 29b are provided in order to improve the color purity and the reflection characteristic of the color light beams hr, hg and hb from which display light is formed. In this instance, the color filter 29r which passes red light therethrough is disposed on each of the red pixels 10r; the color filter 29g which passes green light therethrough is disposed on each of the green pixels 10g; and the color filter 29b which passes blue right therethrough is disposed on each of the blue pixels 10b. The color filters 29r, 29g and 29b are formed by a printing method.

The black matrix 31 is provided in order to prevent external light reflected principally by the driving wiring lines 14 below the flattening insulating film 15 from being emitted in the displaying direction. The black matrix 31 is provided between the organic electroluminescence light emitting elements ELr, ELg and ELb, that is, between the color filters 29r, 29g and 29b. The black matrix 31 is formed, for example, from a thin film filter formed by stacking thin films of chromium (Cr) and chromic oxide and patterning the thin films by a lithography technique and etching or from a black resin film formed by exposing a photosensitive resin material to light to pattern the resin material. Or, the black matrix 31 may be formed by placing end edges of two ones of the color filters 29r, 29g and 29b of different colors one on the other.

Figure 3A:
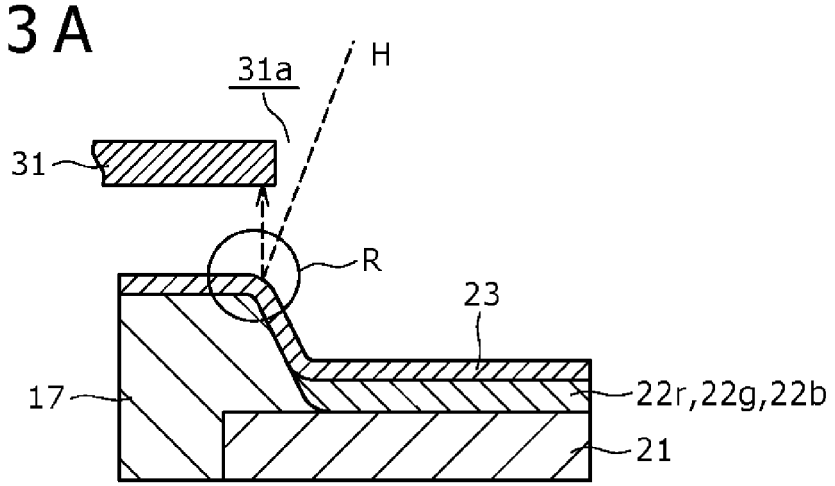
FIGS. 3A, 3B, and 3C are enlarged sectional views illustrating an arrangement state of a black matrix in the display apparatus.
Figure 3B:
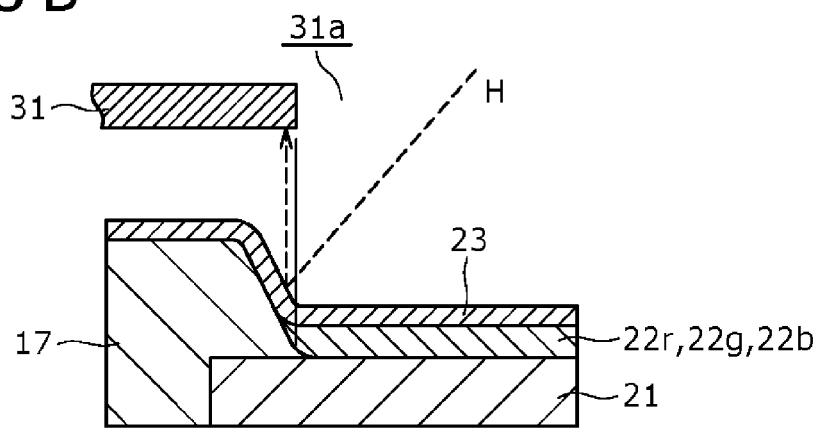
Figure 3C:
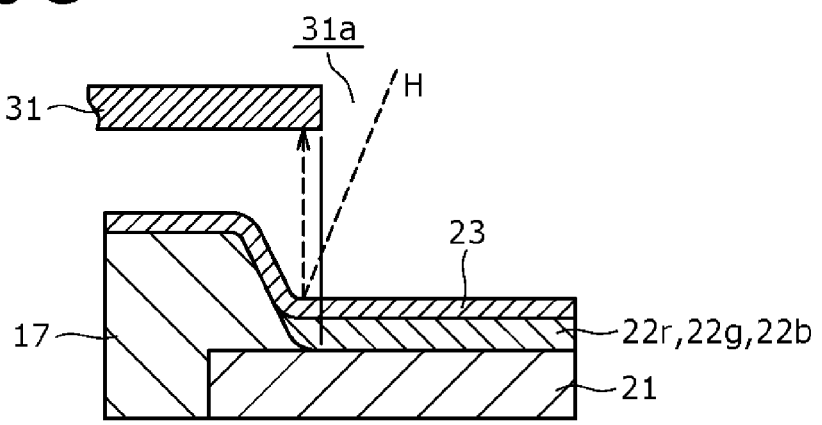

FIGS. 3A to C illustrate arrangement states of the black matrix 31. In the following, details of the arrangement states of the black matrix 31 with respect to the partition 17 are described with reference to FIGS. 3A to 3C.

As described above, the side walls of each aperture 17a of the partition 17 are formed in a tapering shape such that they are inclined in a tapering shape such that the aperture width increases toward the emitting direction of generated light from the organic electroluminescence light emitting elements ELr, ELg and ELb. Therefore, if external light is reflected in the same direction by the inclined side wall portions, more particularly by the surface portions of the upper electrode 23 which covers the side wall portions, then the visual observability of generated light or display light from the display apparatus 1 is deteriorated significantly by the reflected external light. Particularly, where the upper electrode 23 functions as a half mirror, the external light is reflected strongly by the upper electrode 23.

Therefore, the black matrix 31 is provided in such a state that it covers an upper end portion of the tapering shape of at least one side, that is, one end edge in one direction, which forms each aperture 17a of the partition 17. Such a black matrix 31 as just described is configured particularly in the following manner.

In particular, the black matrix 31 is configured such that it covers over an upper edge portion R of a side wall of the tapering shape at least on one of the sides or end edges which form the aperture 17a of the partition 17 as seen in FIG. 3A.

Preferably, the black matrix 31 is provided in such a state that it covers a most inclined portion of the tapering shape of the side wall of the aperture 17a of the partition 17 as seen in FIG. 3B.

More preferably, the black matrix 31 is provided in such a state that it fully covers over an aperture edge portion of the tapering shape on the side wall of the aperture 17a of the partition 17 as seen in FIG. 3C.

Further, where the aperture 17a of the partition 17 has a rectangular plane shape elongated in one direction as seen in FIG. 4, preferably at least one side or end edge from two long sides of the rectangular shape is covered with the black matrix 31 described above with reference to FIGS. 3A to 3C. Or, sides or end edges on the different sides of those apertures 17a corresponding to pixels of the same color from among the pixels 10r, 10g and 10b for displaying light beams of three different colors may be covered with the black matrix 31. In the example illustrated in FIG. 4, the apertures 17a may be disposed such that three apertures 17a one of the two long sides of which is covered and three apertures 17a the other one of which is covered are disposed alternately in accordance with the arrangement of the pixels 10r, 10g and 10b which emit light beams of the three colors. Or else, one of two long sides may be covered with the black matrix 31 in an irregular order among the aperture 17a corresponding to the pixels of the same color.

Where the black matrix 31 is disposed in such a manner as described above with respect to the apertures 17a of the partition 17, external light H incoming to the substrate 10 side from the light extraction side is prevented from being reflected by the side walls of the tapering shape of the apertures 17a of the partition 17 toward the front direction. Particularly, the upper edge portion R of the tapering shape of each of the side walls of the apertures 17a of the partition 17 is a portion at which the inclination angle gradually increases from a direction toward the front of the substrate 10. Therefore, while the external light H incoming at a shallow angle with respect to a normal to the substrate 10 and passing through the apertures 31a of the black matrix 31 is likely to be reflected toward the front direction of the substrate 10 by the upper edge portions R, since the upper edge portions R are covered with the black matrix 31, the reflected external light H is prevented from being emitted toward the front direction.

Further, where the black matrix 31 is provided in such a state that it covers a most inclined portion of the tapering shape of the side wall of each aperture 17a of the partition 17 as seen in FIG. 3B, external light H incoming at a great angle to a normal to the substrate 10 can be prevented from being emitted toward the front direction.

Furthermore, wherein the black matrix 31 is provided in such a state that it fully covers over an aperture edge portion of the tapering shape on a side wall of each aperture 17a of the partition 17 as seen in FIG. 3C, external light H reflected by the side wall portions covered with the black matrix 31 can be fully prevented from being emitted toward the front direction.

As a result, it becomes possible to prevent deterioration of the visual observability of display light caused by reflection of external light, and consequently, it is possible to achieve enhancement of the display characteristic of the display apparatus. Particularly where the organic electroluminescence light emitting elements ELr, ELg and ELb have a resonator structure, the directivity of the generated light beams hr, hg and hb from the organic electroluminescence light emitting elements ELr, ELg and ELb is high. Therefore, the generated light beams hr, hg and hb are likely to be emitted toward the front direction. Accordingly, even where the black matrix 31 is swollen into the apertures 17a of the partition 17 which serve as pixel apertures as in the configuration described above, the loss by interception of the generated light beams hr, hg and hb by the black matrix 31 can be suppressed to the minimum.

Further, where end edges on the different sides of the apertures 17a corresponding to the pixels of the same color from among the pixels 10r, 10g and 10b for displaying three color light beams as described above with reference to FIG. 4, in addition to the advantages achieved by the configuration described hereinabove, interference of external light beams of different colors incoming as particular wavelengths as a result of passage of the external light beams through the color filters 29r, 29g and 29b of the same colors when the external light beams are diffused and reflected by the side walls of the apertures 17a can be prevented. Consequently, appearance, for example, of interference fringes or moirés can be prevented effectively.

It is to be noted that, where the numerical aperture is sufficiently high, the upper edge portion R of the tapering shape may be covered over the entire periphery of each aperture 17a with the black matrix 31. With the configuration just described, external light beams incoming from different directions to the substrate 10 can be prevented from being reflected by the side walls of the apertures 17a of the partition 17 and emitted to the front or to directions other than the front direction. Consequently, the effect that deterioration of the visual observability is prevented can be further made certain. Further, the upper edge portion R of the tapering structure on two or three sides of each aperture 17a of a rectangular shape may be covered with the black matrix 31. Since the effect of prevention of emission of reflected external light to the front direction increases as the portion covered with the black matrix 31 increases, preferably a portion as much as possible of each aperture 17a including the long sides is covered with the black matrix 31.

Further, as a configuration which can assure the viewing angle characteristic by a certain degree while preventing deterioration of the visual observability caused by extraction of reflected external light toward the front direction, a configuration shown in FIG. 5 can be used. Referring to FIG. 5, the shape of an aperture of each pixel, that is, the shape in plane of each aperture 17a of the partition 17, is set to a rectangular shape elongated in the leftward and rightward direction on a display plane. Further, the black matrix 31 is provided in such a state that it covers an upper edge portion of the tapering shape from between upper and lower long sides or end edges of each aperture 17a.

Also in this instance, the black matrix 31 may be configured such that it covers over an upper edge portion R of a side wall of the tapering shape at least on one of the sides or end edges which form the aperture 17a of the partition 17 as seen in FIG. 3A. Preferably, the black matrix 31 is provided in such a state that it covers a most inclined portion of the tapering shape of the side wall of the aperture 17a of the partition 17 as seen in FIG. 3B. More preferably, the black matrix 31 is provided in such a state that it fully covers over the tapering shape on the side wall of the aperture 17a of the partition 17 as seen in FIG. 3C.

Or, end edges on the different sides of those apertures 17a corresponding to pixels of the same color from among the pixels 10r, 10g and 10b for displaying light beams of three different colors may be covered with the black matrix 31 similarly as described hereinabove with reference to FIG. 4.

Where such configurations as described above are applied, the apertures 17a of the partition 17 are prevented from being covered with the black matrix 31 in the leftward and rightward direction on the display plane thereby to maintain the viewing angle. Besides, emission of reflected external light from the side walls in the long side direction of the apertures 17a of the partition 17 toward the front direction can be prevented.

Further, the plane shape of each aperture 17a of the partition 17 may be such that it is formed only from a curved line as hereinafter described or it exhibits a non-parallel state between different apertures in combination with any of the configurations of the black matrix 31 described above. Particular examples of such an aperture as described above are described below.

<First Example of the Aperture of the Partition>

Figure 6:
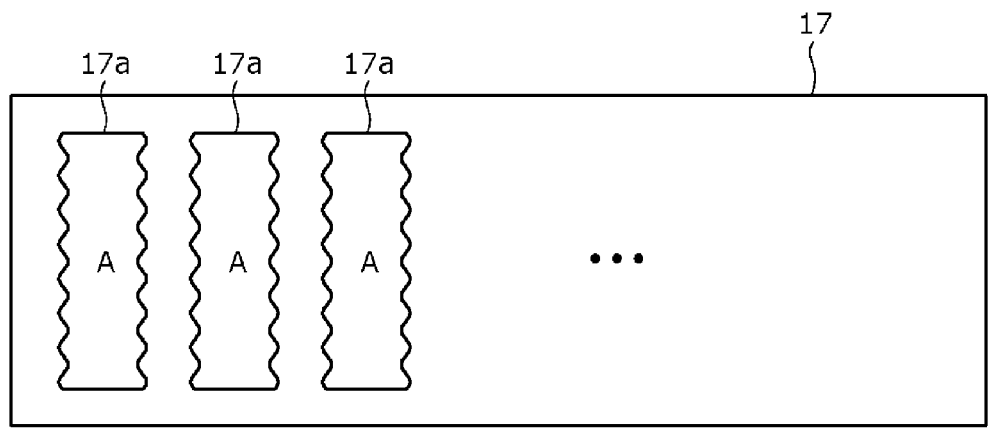
FIGS. 6, 7, 8, and 9 are schematic plan views showing different examples of a shape in plan of apertures of a partition in the display apparatus.

FIG. 6 shows a first example of the shape in plan of the apertures 17a where the apertures 17a are viewed from the front face side, that is, from the upper electrode 23 side. Referring to FIG. 6, the shape in plan when each of the apertures 17a provided on the partition 17 is viewed from the upper electrode 23 side of the display face is formed as a plane shape A whose two sides in a long side direction are each formed from a curved line which varies periodically. The curved line of the plane shape A has a periodical waveform having, for example, an amplitude of approximately 1 to 10 μm and a period of 1 to 100 μm. In this instance, the apertures 17a may have the same plane shape A. It is to be noted that, also in the apertures 17a having the plane shape A, the side walls extending from the sides of the curved lines are inclined in a tapering shape.

Where each aperture 17a of the partition 17 has such a plane shape as seen in FIG. 6, external light incident to the side walls of the apertures 17a of the aperture 17a from the upper electrode 23 side is diffused and reflected by the side walls of the long-side sides corresponding to the sides of the curved line portions. Therefore, the external light is prevented from being reflected toward the same direction, and consequently, a phenomenon that the reflected light beams interfere with each other can be moderated. By this, the visual observability of emitted light from the organic electroluminescence light emitting elements ELr, ELg and ELb provided corresponding to the apertures 17a is assured. As a result, enhancement of the display characteristic of the display apparatus 1 can be anticipated.

It is to be noted that, while the curved line which forms the plane shape A of the apertures 17a of the partition 17 in the first example described above has a periodic waveform, the plane shape A may otherwise have a non-periodic curved line, that is, a curved line whose amplitude and period are not fixed. Further, while two sides in the long side direction of the apertures 17a provided in the partition 17 are formed from a curved line, both of the long and short sides of the overall periphery of each aperture 17a may be formed from a curved line. In this instance, the effect of prevention of deterioration of the visual observability caused by reflection of external light by the side walls of the apertures 17a of the partition 17 is further assured.

<Second Example of the Aperture of the Partition>

Figure 7:
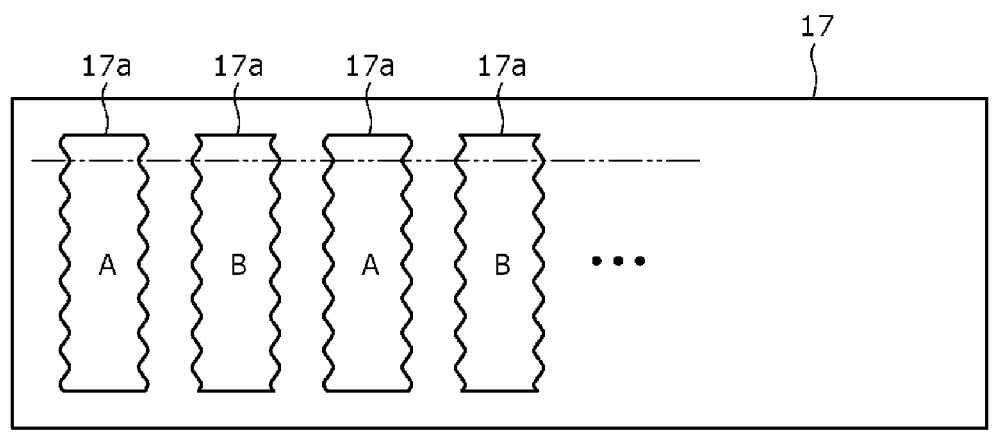

FIG. 7 shows a second example of the plane shape of an aperture 17a as viewed from the front side or upper electrode 23 side. Referring to FIG. 7, each of the apertures 17a provided in the partition 17 is formed so as to have a plane shape A or B whose two sides in the long side direction are each formed only from a curved line which varies periodically. The plane shape B is different in phase of the period of the curved line of the two sides in the long side direction from the plane shape A. For example, the phase of the period of the curve line of the plane shape B is reversed from that of the plane shape A at the position spaced by the same distance from any of the two minor sides. The apertures 17a having such plane shapes A and B are disposed alternately.

Where the apertures 17a of the partition 17 have such a shape in plan as seen in FIG. 7, in addition to the advantages achieved by the configuration described hereinabove with reference to FIG. 6, an advantage that external light beams diffused and reflected by the side walls of the adjacent apertures 17a are prevented from interfering with each other can be anticipated. Similarly, interference between external light diffused and reflected by the side walls of the apertures 17a having the plane shape A and external light diffused and reflected by the side walls of the apertures 17a having the plane shape B can be prevented. As a result, the visual observability of emitted light from the organic electroluminescence light emitting elements ELr, ELg and ELb provided corresponding to the apertures 17a can be assured with a higher degree of certainty, and enhancement of the display characteristic of the display apparatus 1 can be anticipated.

It is to be noted that, also in the second example of the apertures, the curved lines which form the plane shapes A and B of the apertures 17a of the partition 17 may be non-periodic curved lines or the long sides and the short sides of the overall periphery of each aperture 17a may be formed from curved lines similarly as in the first example described hereinabove.

<Third Example of the Aperture of the Partition>

Figure 8:
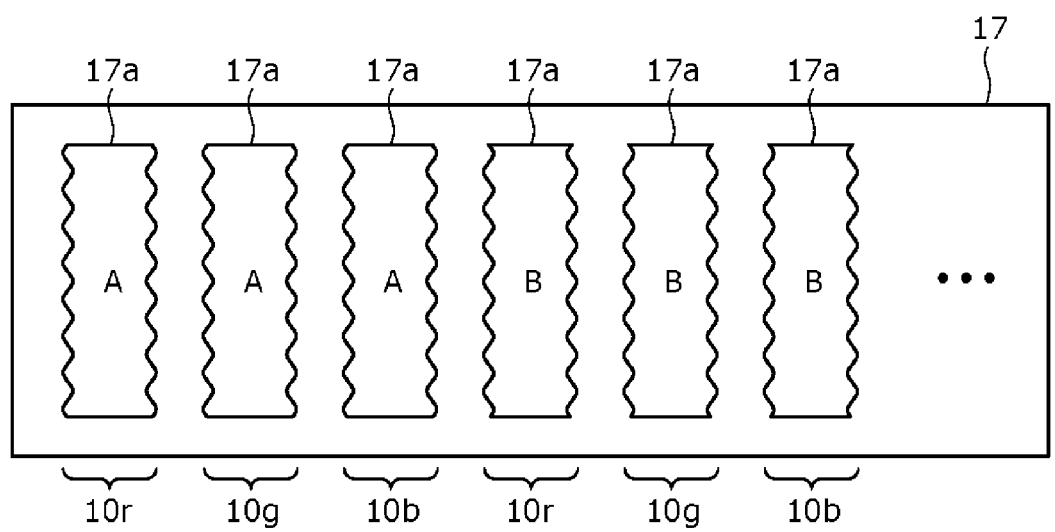

FIG. 8 shows a third example of the plane shape of the apertures 17a as viewed from the front face or upper electrode 23 side. Referring to FIG. 8, each of the apertures 17a provided in the partition 17 is formed so as to have a plane shape A or B whose two sides in the long side direction are each formed only from a curved line which varies periodically. The plane shapes A and B are similar to those described hereinabove with reference to FIG. 7, and the two sides on the long-side side thereof are formed from curved lines whose phases are displaced from each other. Here, the apertures 17a having such plane shapes A and B as described above are disposed such that three apertures 17a having the plane shape A and three apertures 17a having the plane shape B are disposed alternately in accordance with the arrangement of the pixels 10r, 10g and 10b which emits light beams of the three colors.

Where the apertures 17a of the partition 17 have such shapes in plan as described above with reference to FIG. 8, in addition to the advantages achieved by the configuration described hereinabove with reference to FIG. 6, interference of external light beams of different colors incoming as particular wavelengths as a result of passage of the external light beams through the color filters 29r, 29g and 29b of the same colors when the external light beams are diffused and reflected by the side walls of the apertures 17a can be prevented.

In particular, external light of red passes through the color filters 29r and comes to and is reflected by the red pixels 10r and external light of green passes through the color filters 29g and comes to and is reflected by the green pixels 10g while external light of blue passes through the color filter 29b and comes to and is reflected by the blue pixel 10b. In this instance, the external light beams reflected by the side walls of the apertures 17a and having same wavelengths and hence same colors interfere with each other. However, according to the configuration described above with reference to FIG. 8, since the apertures 17a of the partition 17 at pixels of the same color disposed nearest to each other have the plane shapes A and B whose phases are displaced from each other, the interference described above can be prevented. As a result, the visual observability of emitted light from the organic electroluminescence light emitting elements ELr, ELg and ELb provided corresponding to the apertures 17a can be assured with a higher degree of certainty, and enhancement of the display characteristic of the display apparatus 1 can be anticipated.

It is to be noted that, also in the third example of the apertures, the curved lines which form the plane shapes A and B of the apertures 17a of the partition 17 may be non-periodic curved lines or the long sides and the short sides of the overall periphery of each aperture 17a may be formed from curved lines similarly as in the first example described hereinabove.

It is to be noted that, where such first to third examples as described above are combined with the arrangement states of the black matrix 31 described hereinabove with reference to FIGS. 3 to 5, also the shape of the apertures 31a of the black matrix 31 may be changed in accordance with the shape of the apertures 17a of the partition 17 as occasion demands. Preferably, the black matrix 31 covers over an upper edge portion of each aperture 17a of the partition 17 at a position at which the plane shape of the aperture 17a is swollen most in the aperture 17a.

<Fourth Example of the Aperture of the Partition>

Figure 9:
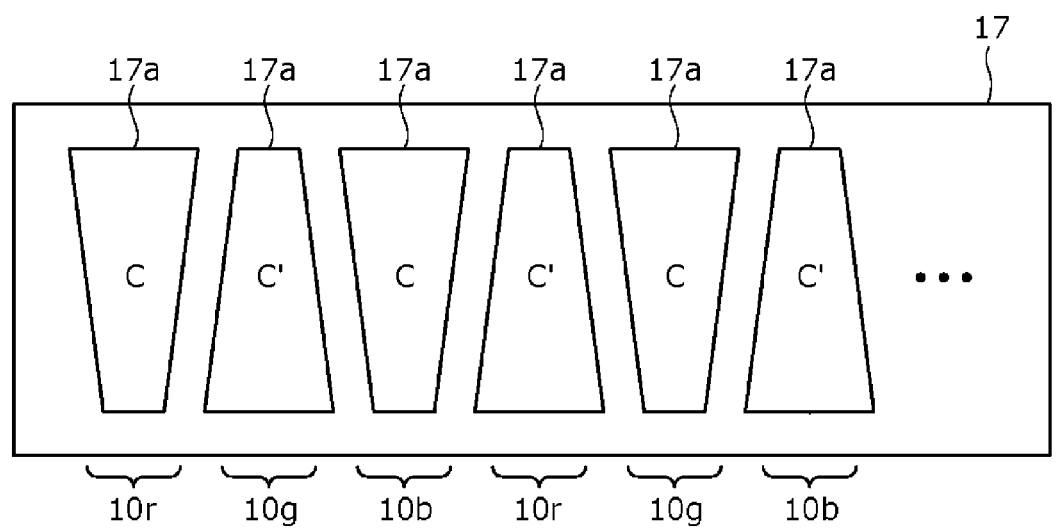

FIG. 9 shows a fourth example of the plane shape of the apertures 17a as viewed from the front face or upper electrode 23 side. Referring to FIG. 9, the apertures 17a provided in the partition 17 are formed such that one side of a shape in plan of one of each two adjacent ones thereof extends non-parallelly to that of the other aperture 17a.

In particular, the apertures 17a provided in the partition 17 are formed so as to have trapezoidal plane shapes C and C' whose two sides in the long side direction do not extend in parallel to each other. The plane shapes C and C' may be disposed alternately in the short side direction such that the upper and lower bottoms thereof are reversed therebetween. It is to be noted that the side walls also of the apertures 17a of the plane shapes C and C' are inclined in a tapering shape.

Consequently, the two major sides which form upper portions of the side walls directed in the same direction from among the four sides which form the plane shapes C and C' of adjacent ones of the apertures 17a extend non-parallelly to each other. For example, the left-side long sides of adjacent ones of the apertures 17a extend non-parallelly to each other and also the right-side major sides extend non-parallelly to each other. Further, in this instance, at least one of sides which form the plane shape of one of the apertures 17a corresponding to pixels of the same color extends non-parallelly to that of the other aperture 17a in accordance with the arrangement of the pixels 10r, 10g and 10b which display light beams of the three colors. For example, where attention is paid to the red pixels 10r, among the apertures 17a of adjacent ones of the red pixels 10r, the plane shapes C and C' are disposed alternately. Further, between adjacent ones of the apertures 17a for the red pixels 10r, two major sides which form upper portions of the side walls extending in the same direction extend non-parallelly to each other.

Where the apertures 17a of the partition 17 have such shapes in plan as described with reference to FIG. 9, external light incoming to the side walls of the apertures 17a of the partition 17 from the upper electrode 23 side is reflected in a direction in which the long-side side walls corresponding to the non-parallel sides are directed by the side walls. Therefore, reflection of all of the external light toward the same direction by the side walls of the apertures is prevented, and the visual observability of emitted light from the organic electroluminescence light emitting elements ELr, ELg and ELb provided corresponding to the apertures 17a is assured. As a result, enhancement of the display characteristic of the display apparatus 1 can be anticipated.

Further, since the apertures 17a of the partition 17 at pixels of the same color which are disposed nearest to each other are formed such that the two long sides thereof disposed in the same direction extend non-parallelly to each other as described above, when external light beams of individual colors incoming with particular wavelengths as a result of passage thereof through those of the color filters 29r, 29g and 29b which have the same colors is diffused and reflected by the side walls of the apertures 17a, interference of the external light beams can be prevented. As a result, the visual observability of emitted light from the organic electroluminescence light emitting elements ELr, ELg and ELb provided corresponding to the apertures 17a is assured with a higher degree of certainty. Consequently, enhancement of the display characteristic of the display apparatus 1 can be anticipated.

The partition 17 having the apertures 17a of the plane shapes described hereinabove in connection with the first to fourth examples is obtained by applying, for example, a lithography method. In this instance, the partition 17 itself may be configured in a resist pattern formed by the lithography technique or may be formed by etching of an insulating film wherein the resist pattern formed by the lithography method is used as a mask.

It is to be noted that, in the embodiment described above, the organic electroluminescence light emitting elements ELr, ELg and ELb which emit light beams of different colors are provided in the pixels 10r, 10g and 10b, respectively. However, the present invention can be applied not only to a display apparatus having such a configuration as described above but also widely to various display apparatus which include a partition corresponding to pixel apertures. For example, as regards color display apparatus which include organic electroluminescence light emitting elements, the present invention can be applied also to a configuration which includes organic electroluminescence light emitting elements which include a light emitting layer common to the pixels 10r, 10g and 10b. In this instance, the optical distance L may be differentiated among different pixels or a color conversion layer may be provided for each pixel such that display light beams of different wavelengths are extracted from the pixels 10r, 10g and 10b.

<General Configuration of the Display Apparatus>

Figure 10A:
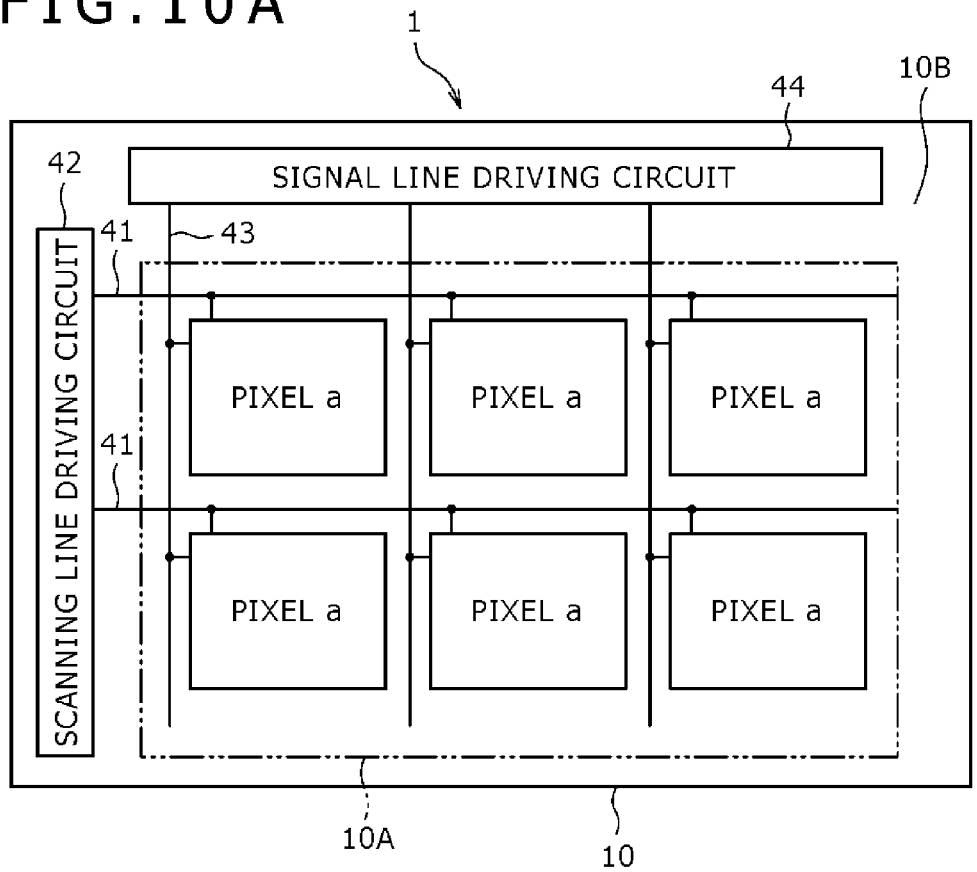
FIG. 10A is a diagrammatic view showing a circuit configuration of the display apparatus and FIG. 10B is a circuit diagram showing a pixel circuit used in the display apparatus.
Figure 10B:
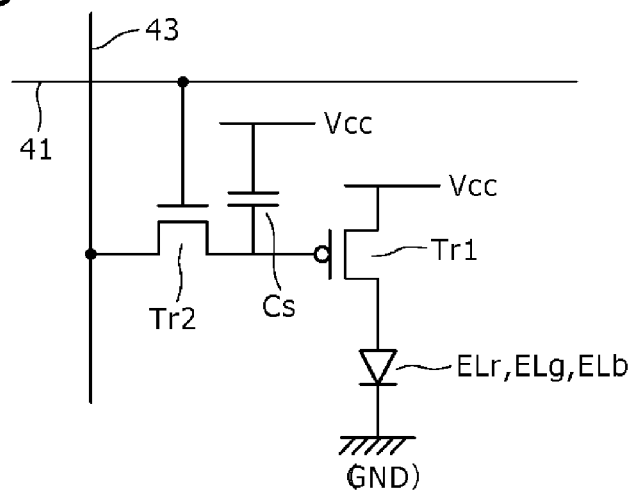

FIG. 10A shows a general configuration of the display apparatus 1 to which the present embodiment is applied, and FIG. 10B shows a configuration of a pixel circuit of the display apparatus 1 shown in FIG. 10A. In the present embodiment, the present invention is applied to a display apparatus of the active matrix type.

Referring first to FIG. 10A, the display apparatus 1 includes a substrate 10 serving as a support board and having a display region 10A and a peripheral region 10B surrounding the display region 10A. The display region 10A is formed as a pixel array section wherein a plurality of scanning lines 41 and a plurality of signal lines 43 are wired perpendicularly to each other and one pixel a is provided corresponding to each of intersecting points of the scanning lines 41 and the signal lines 43. One of the organic electroluminescence light emitting elements ELr, ELg and ELb described hereinabove with reference to FIG. 1 is provided in each of the pixels a. Meanwhile, a scanning line driving circuit 42 for scanning and driving the scanning lines 41 and a signal line driving circuit 44 for supplying an image signal, that is, an input signal, according to luminance information to the signal lines 43 are disposed in the peripheral region 10B.

Referring now to FIG. 10B, the pixel circuit provided in each pixel a includes, for example, one of the organic electroluminescence light emitting elements ELr, ELg and ELb, a driving transistor Tr1, a writing transistor Tr2 and a retaining capacitor Cs. If the pixel circuit is driven by the scanning line driving circuit 42, then an image signal written from the corresponding signal line 43 through the writing transistor Tr2 is retained by the retaining capacitor Cs, and current corresponding to the retained signal amount is supplied to the red light emitting element ELr, ELg or ELb from the driving transistor Tr1. Consequently, the red light emitting element ELr, ELg or ELb emits light with luminance corresponding to the current value.

It is to be noted that such a configuration of the pixel circuit as described above is a mere example to the end, but the pixel circuit may be configured otherwise including a capacitance element or including a plurality of transistors. In this instance, a necessary driving circuit is additionally provided in the peripheral region 10B in accordance with the modification to the pixel circuit.

Figure 11:
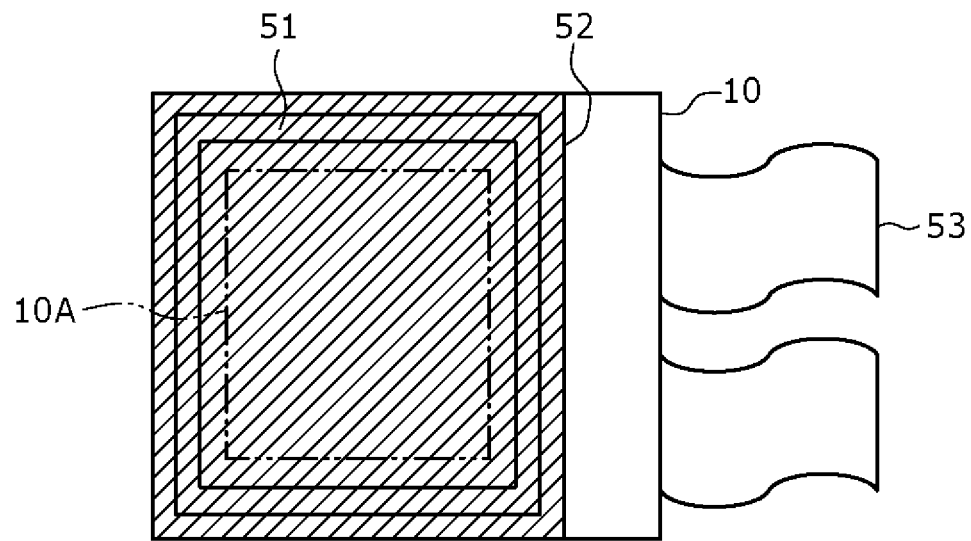
FIG. 11 is a schematic view showing a display apparatus in the form of a module of an enclosed configuration to which the present embodiment is applied.

The display apparatus described above to which the present embodiment is applied includes such a display apparatus of the module type wherein it is in an encapsulated form as seen in FIG. 11. Referring to FIG. 11, the display apparatus shown has, for example, a sealing section 51 provided so as to surround the display region 10A which is formed as a pixel array section thereby to form a display module. The sealing section 51 is used as a bonding agent to adhere the substrate 10 to an opposing member, that is, an embedding substrate 52, which is a transparent glass plate or the like. The transparent embedding substrate 52 may have a color filter, a protective film, a light blocking film and so forth provided thereon. It is to be noted that flexible printed boards 53 for inputting and outputting a signal to and from the display region 10A from and to the outside are provided on the substrate 10 as the display module on which the display region 10A is formed.

Application Examples

The display apparatus described above to which the present embodiment is applied can be applied as a display apparatus for various electronic device shown in FIGS. 12 to 16, that is, for various electronic device in various fields which display an image signal inputted thereto or an image signal generated therein as an image such as, for example, a digital camera, a notebook type personal computer, a portable terminal apparatus such as a portable telephone set, and a video camera. In the following, several examples of an electronic device to which the present embodiment is applied are described.

Figure 12:
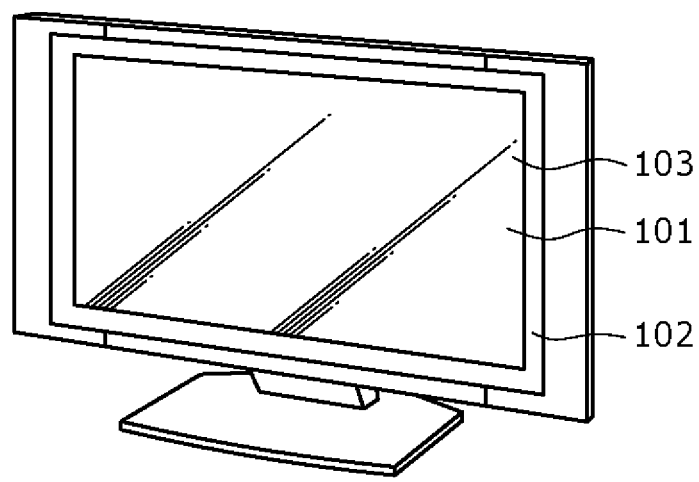
FIG. 12 is a perspective view showing a television set to which the present embodiment is applied.

FIG. 12 shows a television set to which the present embodiment is applied. Referring to FIG. 12, the television set according to the present application includes an image display screen section 101 composed of a front panel 102, a filter glass plate 103 and so forth. The image display screen section 101 is formed from a display apparatus to which the present embodiment is applied.

Figure 13A:
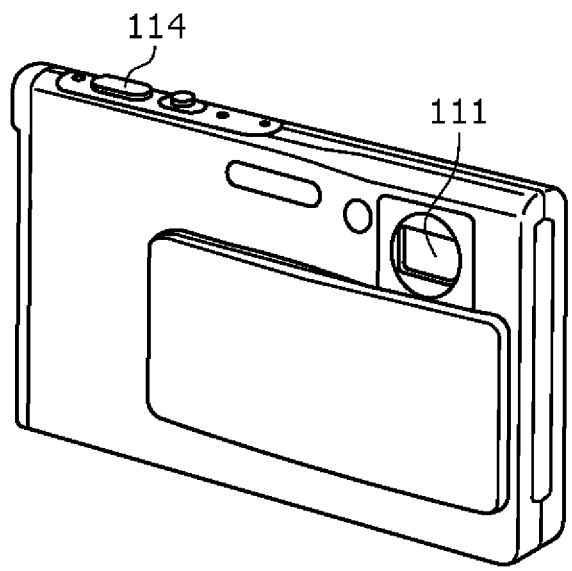
FIGS. 13A and 13B are perspective views as viewed from different directions showing a digital camera to which the present embodiment is applied.
Figure 13B:
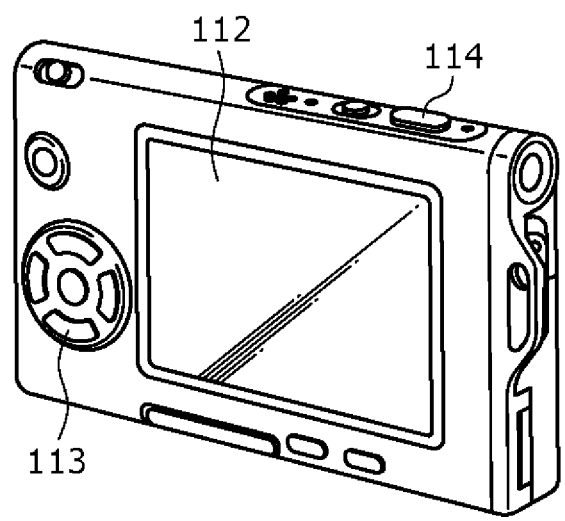

FIGS. 13A and 13B show a digital camera to which the present embodiment is applied, and particularly, FIG. 13A is a perspective view as viewed from the front side and FIG. 13B is a perspective view as viewed from the rear side. Referring to FIGS. 13A and 13B, the digital camera according to the present application includes a light emitting section 111 for emitting flashlight, a display section 112, a menu switch 113, a shutter button 114 and so forth. The display section 112 is formed from a display apparatus to which the present embodiment is applied.

Figure 14:
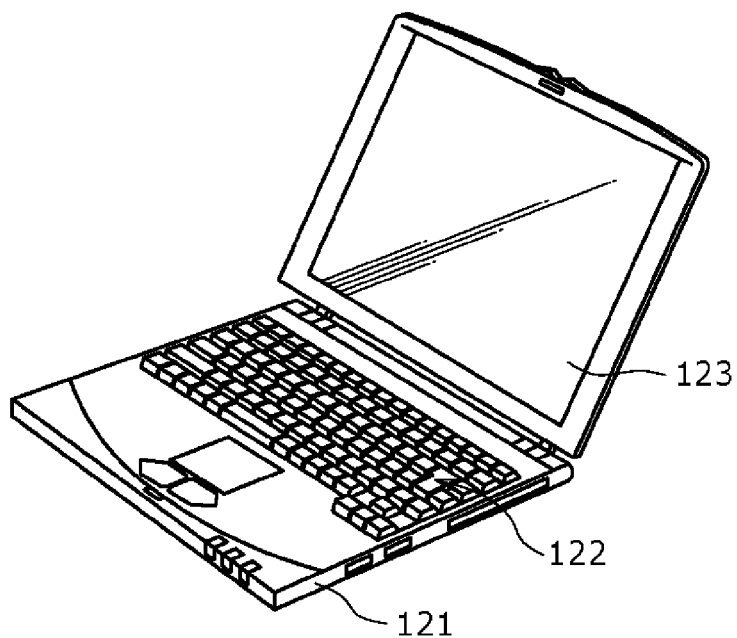
FIG. 14 is a perspective view showing a notebook type personal computer to which the present embodiment is applied.

FIG. 14 shows a notebook type personal computer to which the present embodiment is applied. Referring to FIG. 14, the notebook type personal computer according to the present application includes a keyboard 122 operated in order to input a character or the like, a display section 123 for displaying an image and so forth provided on a body 121. The display section 123 is formed from a display apparatus to which the present embodiment is applied.

Figure 15:
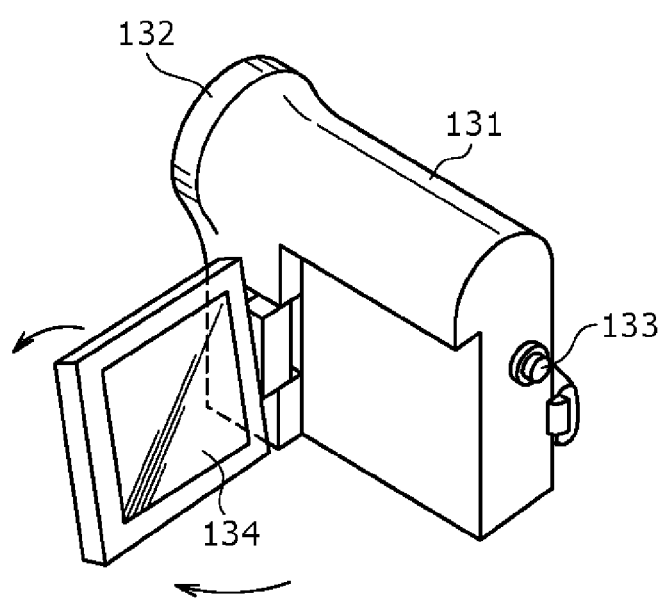
FIG. 15 is a perspective view showing a video camera to which the present embodiment is applied.
Figure 16E:
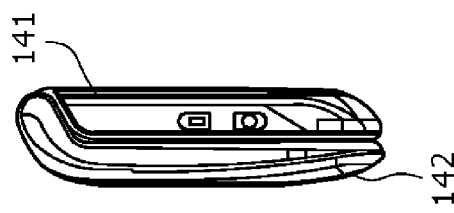
FIGS. 16A, 16B, 16C, 16D, 16E, 16F, and 16G show a portable terminal apparatus such as a portable telephone set to which the present embodiment is applied and are a front elevational view and a side elevational view of the portable telephone set in an open state and a front elevational view, a left side elevational view, a right side elevational view, a top plan view and a bottom plan view of the portable telephone set in a closed state, respectively.
Figure 16F:
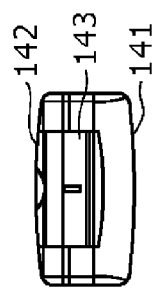
Figure 16C:
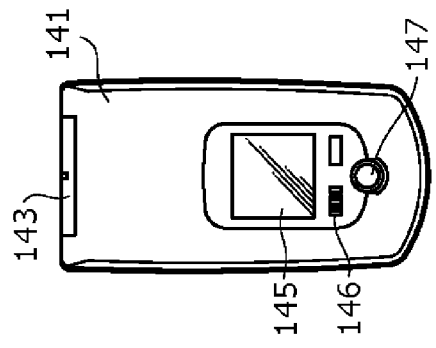
Figure 16G:
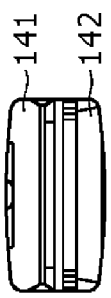
Figure 16D:
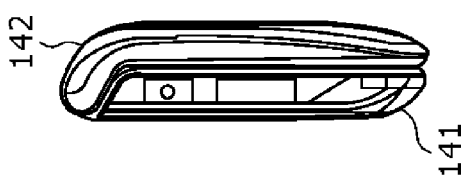
Figures 16A, 16B:
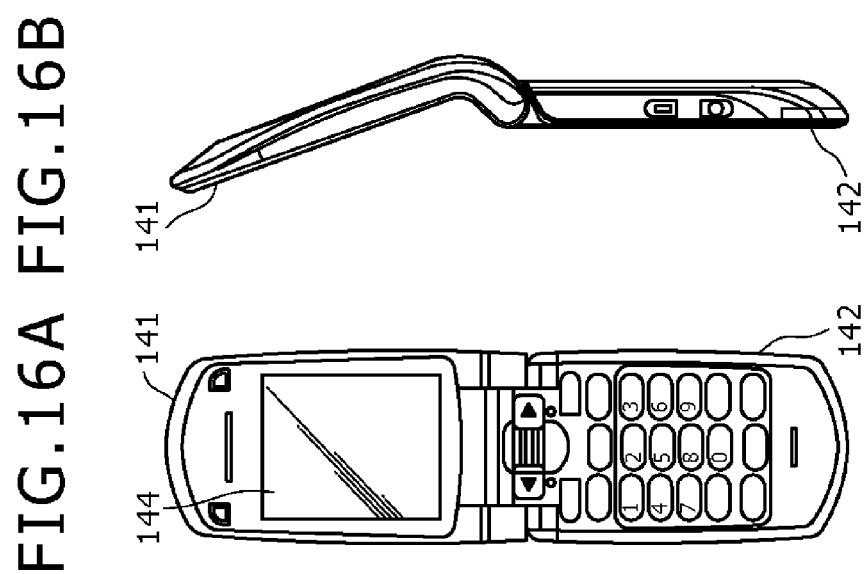

FIG. 15 shows a video camera to which the present embodiment is applied. Referring to FIG. 15, the video camera according to the present application includes a body section 131, and a lens 132 for picking up an image of an imaging object, a start/stop switch 133 for starting and stopping image pickup, a display section 134 and so forth provided on a side face of the body section 131 which is directed forwardly. The display section 134 is formed from a display apparatus to which the present embodiment is applied.

FIGS. 16A to 16G show a portable terminal apparatus such as, for example, a portable telephone set to which the present embodiment is applied. Referring to FIGS. 16A to 16G, the portable telephone set to which the present embodiment is applied includes an upper side housing 141, a lower side housing 142, a connection section 143 in the form of a hinge member, a display section 144, a sub display section 145, a picture light 146, a camera 147 and so forth. The display section 144 or the sub display section 145 is formed from a display apparatus to which the present embodiment is applied.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display apparatus, comprising:
  a substrate;
  a plurality of light emitting elements provided over said substrate and each formed from a lower electrode, a light emitting function layer and an upper layer stacked;
  a partition for element isolation provided over said substrate and having a plurality of apertures corresponding to said light emitting elements; and
  a light shielding portion disposed on the light extraction side of said light emitting elements and having a shape with which said light shielding portion covers over portions between said light emitting elements; wherein
    each of said apertures of said partition having a side wall is formed in such a tapering shape that the aperture width increases toward the light extraction side of said light emitting elements, wherein the light shielding portion is provided to cover at least upper edge portions of the tapering shape on a first side of the aperture for at least a first one of the light emitting elements and a second side of the aperture for at least a second one of the light emitting elements, the first side being different than the second side.

2. The display apparatus according to claim 1, wherein said light shielding portion is provided to fully cover an aperture end edge of the tapering shape on at least one side which defined each aperture of said partition.

3. The display apparatus according to claim 1, wherein said light shielding portion is provided to cover at least one of two long sides which define each aperture of said partition.

4. The display apparatus according to claim 1, wherein said light emitting elements are formed in a structure which resonates and emits light generated by said light emitting elements.

5. The display apparatus according to claim 1, wherein pixels of different colors from which light beams of different wavelengths are extracted are set corresponding to said apertures, and said light shielding portion covers end edges on different sides of the apertures corresponding to pixels of a same color from among said pixels of different colors.

6. The display apparatus according to claim 5, further comprising a color filter provided on the light extraction side of said light emitting elements.

7. An electronic device, comprising:
a display panel including a substrate, a plurality of light emitting elements provided over said substrate and each formed from a lower electrode, a light emitting function layer and an upper layer stacked in this order, a partition for element isolation provided over said substrate and having a plurality of apertures corresponding to said light emitting elements, and a light shielding portion disposed on the light extraction side of said light emitting elements and having a shape with which said light shielding portion covers over portions between said light emitting elements; wherein
each of said apertures of said partition having a side wall is formed in such a tapering shape that the aperture width increases toward the light extraction side of said light emitting elements,
wherein the light shielding portion is provided to cover at least upper edge portions of the tapering shape on a first side of the aperture for at least a first one of the light emitting elements and a second side of the aperture for at least a second one of the light emitting elements, the first side being different than the second side.

8. The electronic device according to claim 7, said light shielding portion is provided in such a manner as to cover over a most inclined portion of the tapering shape on at least one side which defines each aperture of said partition.

9. The electronic device according to claim 7, wherein shapes of the light shielding portion and shapes of the apertures are different in at least two of the light emitting elements.

10. A display apparatus, comprising:
a substrate;
a plurality of light emitting elements provided over said substrate and each formed from a lower electrode, a light emitting function layer and an upper layer stacked;
a partition for element isolation provided over said substrate and having a plurality of apertures individually corresponding to said light emitting elements; and
a light shielding portion disposed on the light extraction side of said light emitting elements and having a shape with which said light shielding portion covers over portions between said light emitting elements; wherein
each of said apertures of said partition having a side wall is formed in such a tapering shape that the aperture width increases toward the light extraction side of said light emitting elements,
the light shielding portion is provided to cover at least upper edge portions of the tapering shape on a first side of the aperture for at least a first one of the light emitting elements and a second side of the aperture for at least a second one of the light emitting elements, the first side being different than the second side, said light shielding portion is provided to cover over a most inclined portion of the tapering shape on at least one side which defines each aperture of said partition.

11. An electronic device, comprising:
a display panel including a substrate, a plurality of light emitting elements provided over said substrate and each formed from a lower electrode, a light emitting function layer and an upper layer stacked in this order, a partition for element isolation provided over said substrate and having a plurality of apertures individually corresponding to said light emitting elements, and a light shielding portion disposed on the light extraction side of said light emitting elements and having a shape with which said light shielding portion covers over portions between said light emitting elements; wherein
each of said apertures of said partition having a side wall is formed in such a tapering shape that the aperture width increases toward the light extraction side of said light emitting elements,
said light shielding portion is provided to cover over a most inclined portion of the tapering shape on at least one side which defines each aperture of said partition, and
or the light shielding portion is provided to cover at least upper edge portions of the tapering shape on a first side of the aperture for at least a first one of the light emitting elements and a second side of the aperture for at least a second one of the light emitting elements, the first side being different than the second side.

12. The display apparatus according to claim 11, wherein shapes of the light shielding portion and shapes of the apertures are different in at least two of the light emitting elements.

13. The display apparatus according to claim 11, wherein said light shielding portion is provided to cover over a most inclined portion of the tapering shape on at least one side which defines each aperture of said partition.

* * * * *